United States Patent [19]
Parat et al.

[11] Patent Number: 5,877,927
[45] Date of Patent: Mar. 2, 1999

[54] METHOD AND APPARATUS FOR PROVIDING ELECTROSTATIC DISCHARGE PROTECTION FOR HIGH VOLTAGE INPUTS

[75] Inventors: Krishna K. Parat; Timothy J. Maloney, both of Palo Alto, Calif.

[73] Assignee: Intel Corporation, Santa Clara, Calif.

[21] Appl. No.: 724,371

[22] Filed: Oct. 1, 1996

[51] Int. Cl.$^6$ .................................................. H02H 9/00
[52] U.S. Cl. ............................................... 361/56; 361/91
[58] Field of Search ............................... 361/56, 91, 111; 365/226, 228

[56] References Cited

U.S. PATENT DOCUMENTS

| | | | |
|---|---|---|---|
| 5,255,146 | 10/1993 | Miller ......................................... | 361/56 |
| 5,400,202 | 3/1995 | Metz et al. .................................. | 361/56 |
| 5,463,520 | 10/1995 | Nelson ....................................... | 361/56 |
| 5,528,188 | 6/1996 | Au et al. .................................... | 327/310 |

OTHER PUBLICATIONS

Maloney & Dabri, *Novel Clamp Circuits for IC Power Supply Protection*, EOS/ESD Symposium, Paper 1.1, Phoenix, Ariz., Sep. 12, 1995.

Wheatley, Jr., *On the Proportioning of Chip Area for Multistage Darlington Power Transistors*, IEEE Trans. Electron. Devices, ED–23, pp. 870–878, 1976.

*Primary Examiner*—Sally C. Medley
*Attorney, Agent, or Firm*—Blakely, Sokoloff, Taylor & Zafman

[57] ABSTRACT

An arrangement for preventing damage to a circuit of an integrated circuit chip due to the occurrence of voltage introduced externally to the integrated circuit is disclosed. The arrangement generally has a timer circuit, a clamping circuit, and an override circuit. The clamping circuit is coupled between an input and ground such that voltages and currents applied to the input are shunted to ground for a first length of time. The timer circuit is coupled to the input and passes a voltage applied to the input for the first length of time. The output of the timer circuit is disabled at the expiration of the first length of time. The override circuit disables the clamping circuit a second length of time after a power supply voltage exceeds a predetermined level.

14 Claims, 3 Drawing Sheets

METHOD AND APPARATUS FOR PROVIDING ELECTROSTATIC DISCHARGE PROTECTION FOR HIGH VOLTAGE INPUTS

FIELD OF THE INVENTION

The present invention relates to electrostatic discharge (ESD) protection for integrated circuits, and more specifically to methods and apparatus for steering ESD current away from integrated circuits.

BACKGROUND OF THE INVENTION

Advances in silicon process technology have led to the development of increasingly smaller sized transistors in integrated circuits. In turn, the decreasing size of transistors has made the circuits increasingly susceptible to damage from ESD events. In order to protect these circuits from damage certain ESD protection schemes have been developed.

Previous approaches to ESD protection include thick-field oxide devices or silicon-controlled rectifier devices coupled to input pads. These devices are effective for protecting signal pads but ineffective for protecting power supply pads because of triggering difficulties and shunting of ESD current through power buses on the integrated circuit (IC) chip that is protected.

Previous approaches also include use of a cantilever diode string connected such that when the voltage on an input pad reaches a certain level, the diodes turn on and create a short circuit between the pad and ground. The cantilever diode string steers the ESD current away from the integrated circuit that could be destroyed by large amounts of current.

Cantilever diode strings alone are not effective when the voltage on the pad being protected is to be switched between multiple voltage levels. On pads where voltages are to be switched, cantilever diode strings alone may respond to each high voltage pulse as if the pulse were an ESD event and couple the pad to ground potential. This would make the high-voltage pad ineffective.

High voltage programming pads such as those found on programmable memory devices are difficult to protect with traditional ESD protection circuits because a high voltage, high current pulse is required to program the memory circuit, and the high current requires low impedance to the circuit receiving the programming pulse. Cantilever diode strings could connect the high voltage programming pulse to potential and prevent the programming pulse from programming the memory circuit.

Cantilever diode strings serve as effective power supply ESD protection without the triggering difficulties of thick-field oxide and silicon-controlled rectifier devices. Because they provide a defined path for ESD current between the pad and ground, cantilever diode strings remove the uncertainty from ESD protection schemes which pass current to a power supply bus. Also, performance of cantilever diode strings does not decrease over time due to use, which allows circuits to survive hundreds or thousands of ESD events.

The standard cantilever diode string as used on low voltage power supply pads cannot be used on pads where fast powering up will occur because each programming pulse is treated as an ESD event and the input voltage is shorted to ground. However, using the novel circuit disclosed herein, appropriate protection can be obtained.

SUMMARY OF THE INVENTION

An electrostatic discharge (ESD) protection circuit is disclosed. The ESD protection circuit generally comprises an ESD clamping circuit, a timer circuit and a power supply voltage (Vcc) override circuit.

The timer circuit enables the ESD clamp circuit at appropriate times to shunt voltages and currents applied to an input to ground. When a voltage is applied to the input, the ESD clamp circuit is enabled for a first length of time. If the voltage applied to the input persists for longer than the first length of time, the ESD clamp circuit is disabled such that the voltage and current applied to the input is no longer shunted to ground. The Vcc override circuit pre-emptively disables the ESD protection circuit a second length of time after Vcc reaches an appropriate operating level.

DETAILED DESCRIPTION

An arrangement for preventing damage to a circuit due to the occurrence of voltage transients applied to an integrated circuit (IC) chip containing the circuit is described. Generally, the arrangement provides protection against voltage transients for certain circumstances and disables such protection for other circumstances. The arrangement may be used to prevent damage to circuits caused by ESD events. In one embodiment, ESD protection is enabled when the power supply voltage is not supplied to a circuit and disabled after the power supply voltage supplied to the circuit reaches a predetermined level or after a voltage has been applied to an input of the circuit for more than a predetermined length of time.

Figure 1:
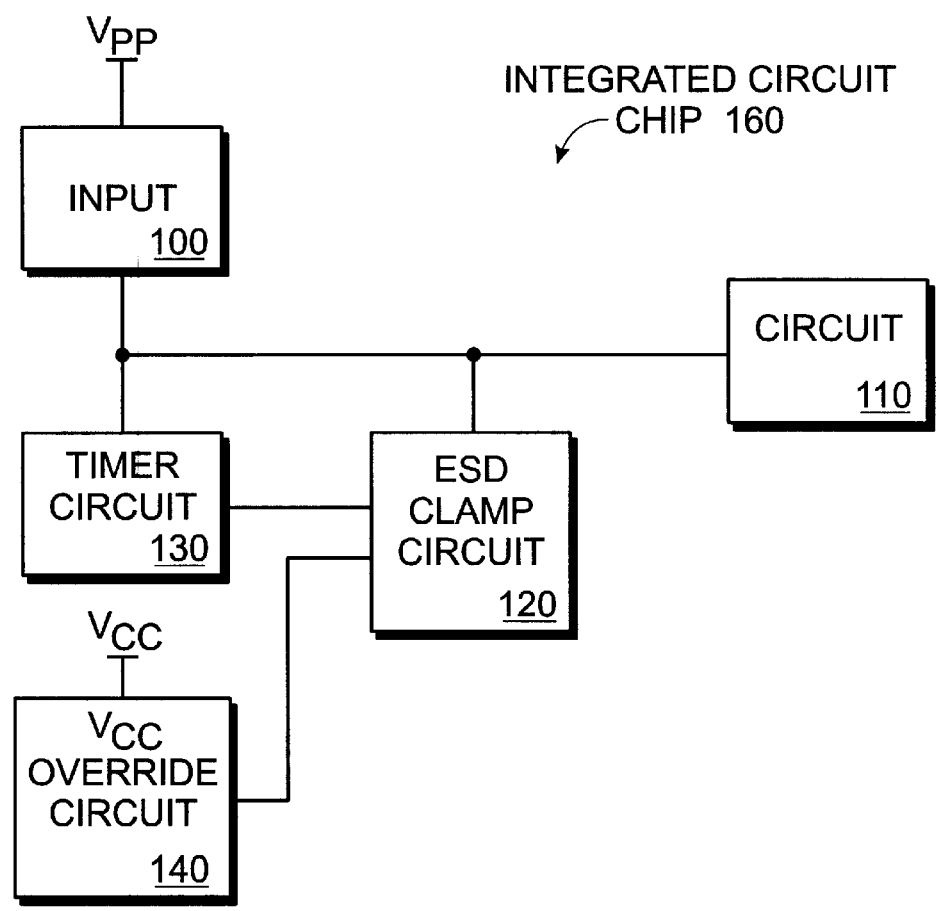
FIG. 1 is a block diagram of one embodiment of an electrostatic discharge circuit of the present invention.

FIG. 1 is a block diagram of one embodiment of an ESD protection scheme. As shown, input 100 (e.g., a pad on an IC die) couples an input voltage (Vpp) to integrated circuit (IC) chip 160, which includes a circuit 110, ESD (or transient) clamping circuit 120, timer circuit 130 and Vcc override circuit 140. Circuit 110 performs a function of IC chip 160 and may include a multiplicity of circuits for performing logic operations. According to one embodiment, integrated circuit 160 is a flash memory device and circuit 110 includes a flash memory array and associated periphery circuits wherein input 100 is coupled to receive a high programming voltage (Vpp). ESD clamp circuit 120, timer circuit 130, and Vcc override circuit 140 are coupled as shown to protect circuit 110 from voltage transients caused by ESD events.

ESD clamp circuit 120 is coupled to input 100 and comprises a cantilever diode string or other circuit to couple input 100 to ground at the appropriate times. When ESD clamp circuit 120 is enabled, input 100 is coupled to ground. Conversely, when ESD clamp circuit 120 is disabled, it acts as an open circuit between input 100 and ground, such that voltages applied to input 100 are applied to circuit 110.

Timer circuit 130 is coupled to input 100 and to ESD clamp circuit 120. Timer circuit 130 enables ESD clamp circuit 120, via a control voltage, such that voltages applied to input 100 are shunted to ground for a predetermined length of time each time an input voltage is applied to input 100. If an input voltage at input 100 persists for longer than the predetermined length of time, the input voltage is applied to circuit 110 after the expiration of the predetermined length of time.

Vcc override circuit 140 is coupled to ESD clamp circuit 120 and receives a power supply voltage (Vcc). Vcc override circuit 140 disables ESD clamp circuit 120 a predetermined length of time after a power supply voltage Vcc supplied to IC chip 160 reaches a predetermined operating level.

As will be apparent from the discussion related to FIG. 2 below, the delay after Vcc reaches an appropriate level and the delay after an input voltage is applied to input 100 are independent of each other. Furthermore, each period of time for which the input 100 is shunted to ground is approximately 2 microseconds, after which the input voltage at input 100 is applied to circuit 110. In one embodiment, the period of time is variable and is selected to be longer than the length of time required for a typical ESD event.

Figure 2:
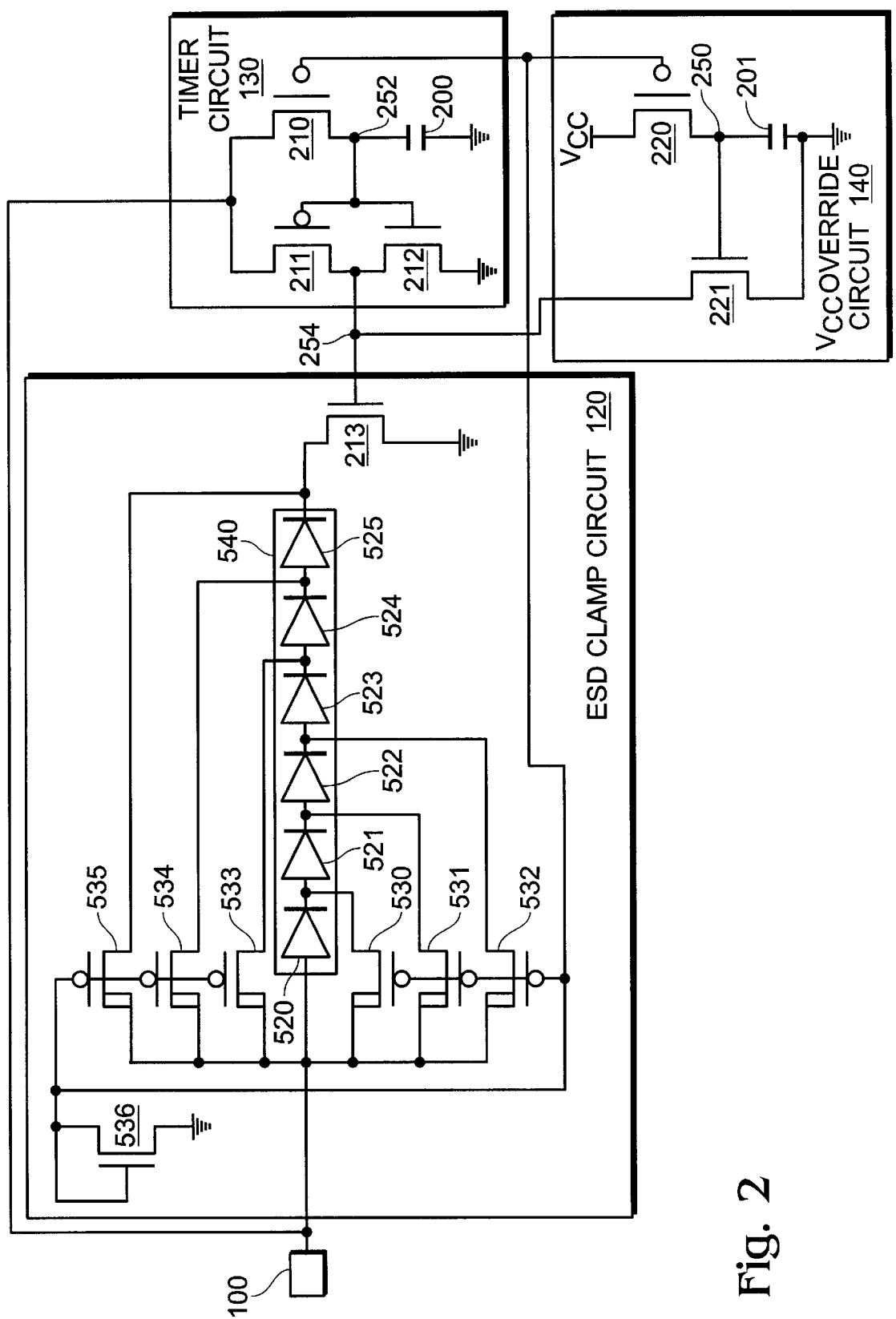
FIG. 2 is an embodiment of a timer, a Vcc override circuit and an ESD clamp circuit of the present invention.

FIG. 2 shows one embodiment of ESD clamp circuit 120, timer circuit 130, and Vcc override circuit 140. Circuit 110 (not shown) is also coupled to input 100. Timer circuit 130 includes transistors 210–212 and capacitor 200. Vcc override circuit 140 includes transistors 220–221 and capacitor 201. ESD clamp circuit 120 includes cantilever diode string 540, associated leakage transistors 530–536, and transistor 213. Cantilever diode string 540 includes diodes 520–525.

Referring to ESD clamp circuit 120, transistors 530–535 are long-channel p-type transistors capable of providing small amounts of current. Diodes 520–525 form parasitic pnp bipolar junction transistors (BJTs) wherein the substrate of IC chip 160 acts as a collector. Thus, each diode 520–526 sinks current as well as passes current to ground through transistor 213.

Figure 3:
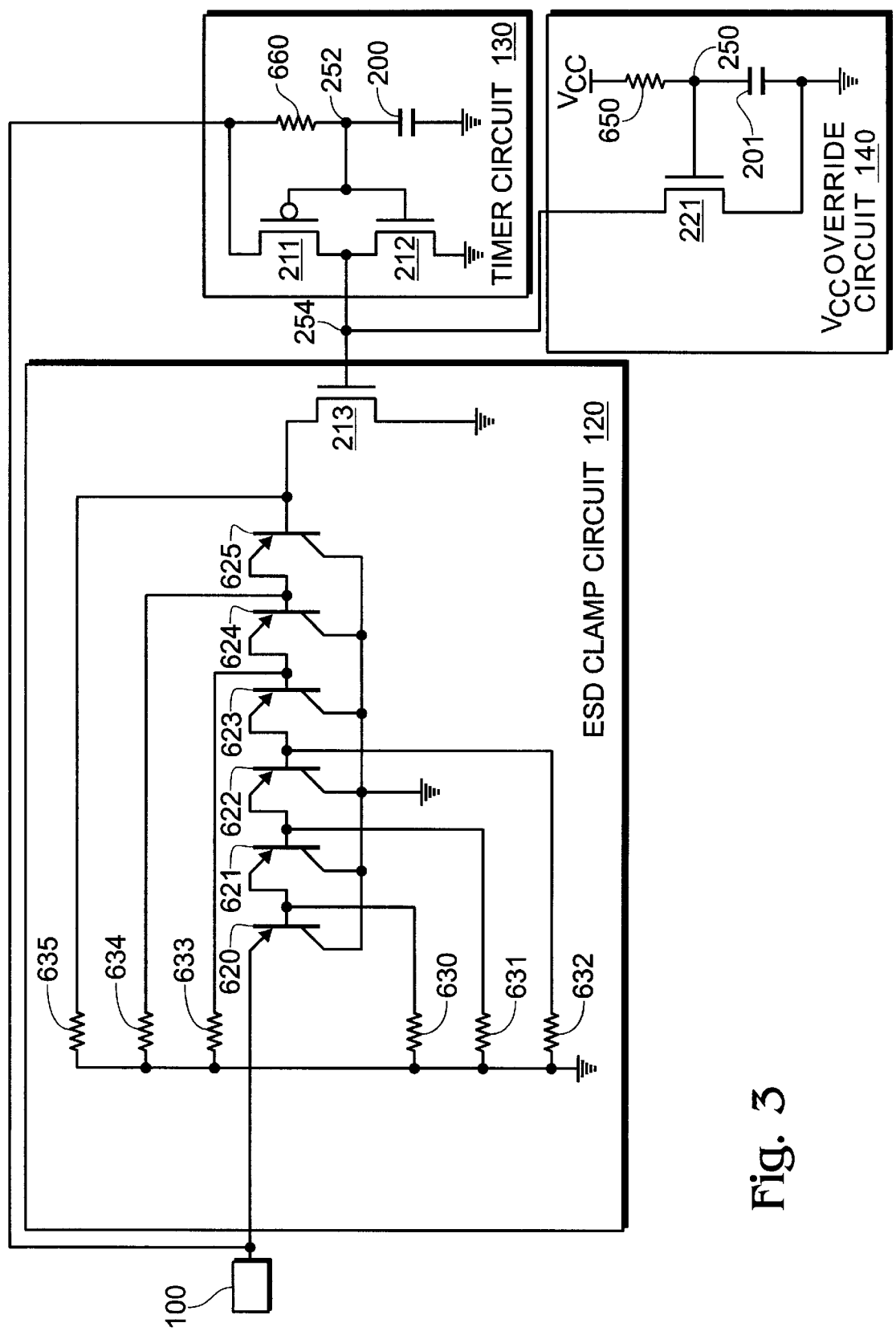
FIG. 3 is an alternative embodiment of a timer, a Vcc override circuit and an ESD clamp circuit of the present invention.

To form diodes 520–525 in an n-well complementary metal oxide semiconductor (CMOS) process, for example, construction of a p+/n-well diode results in a parasitic pnp transistor in the form of a p+/n-well/p-substrate configuration. Thus, as current passes through the p+/n-well junction that forms diodes 520–525, current also passes to the p-substrate of IC chip 160, which forms the collector of the parasitic pnp transistor. Assuming that ($\beta_i$+1) is the emitter current to base current ratio ($I_b/i_e$) and $i_e$ represents the emitter current of stage i, each parasitic pnp transistor passes $$\frac{i_e}{(\beta_i + 1)}$$

to the successive parasitic pnp transistor, while the remaining current, $$\frac{\beta_i}{\beta_i + 1} i_e,$$

drawn by the transistor flows to the substrate of IC chip 160. Thus, in a six-stage ESD clamp circuit (as shown in FIG. 3), transistor 213 sinks $$\frac{i_{100}}{(\beta_1 + 1)(\beta_2 + 1)(\beta_3 + 1)(\beta_4 + 1)(\beta_5 + 1)(\beta_6 + 1)},$$

where $i_{100}$ is the current drawn through input 100 when ESD clamp circuit 120 is enabled. The remaining current flows to ground via the parasitic collectors formed between diodes 520–525 and the substrate of IC chip 160.

Transistor 213 operates as a switch that couples the cathode of diode 525 to ground when transistor 213 is turned on. When the cathode of diode 525 is coupled to ground, diode 525 turns on and operates as a short circuit. This couples the cathode of diode 524 to ground which turns diode 524 on. Diodes 520–525 continue to turn on until all of the diodes of diode string 540 are on. When diodes 520–525 are on, input 100 is coupled to ground, and current from input 100 is shunted to ground via transistor 213 as well as through the parasitic pnp transistors formed by diodes 520–525 and the substrate of IC chip 160 thus protecting circuit 110 (shown in FIG. 1) from high currents that can destroy circuit 110.

When transistor 213 turns off, the cathode of diode 525 is no longer coupled to ground, which turns diode 525 off. When diode 525 turns off, the cathode of diode 524 is no longer coupled to ground and diode 524 turns off. This continues up the cantilever diode string 540 until diodes 520–525 turn off. When any diode of the cantilever diode string 540 turns off, input 100 is no longer coupled to ground. Thus, the voltage applied to the input 100 is applied to circuit 110 (as shown in FIG. 1).

Referring now to timer circuit 130, transistor 210 is a long-channel p-type transistor having a low threshold voltage. Node 252 is initially near ground because capacitor 200 is initially discharged and the gate of transistor 210 is maintained at ground by transistor 536. When the voltage at input 100 reaches the threshold voltage of transistor 210, transistor 210 turns on and the voltage at node 252 rises.

Similarly, when the voltage at input 100 reaches the threshold voltage of transistor 211, transistor 211 turns on because the gate of transistor 211 is at ground and the voltage at node 254 rises. The voltage at node 254 is the control voltage that enables and disables ESD clamp circuit 120 by turning transistor 213 on and off. When the control voltage at node 254 reaches the threshold voltage of transistor 213, transistor 213 turns on because the source of transistor 213 is coupled to ground. Transistor 213 is preferably a high voltage transistor, which has a higher threshold voltage than low voltage transistors.

Transistor 210 is a weak transistor compared to transistor 211 and the capacitance at node 252 is large compared to the capacitance at node 254. As a result, node 254 charges faster than node 252. Thus, transistor 213 is turned on and ESD clamp circuit 120 is enabled when a voltage is applied to input 100 and remains on until node 252 charges to a high enough voltage level to trip inverter pair 211 and 212, which pulls node 254 down. The resistance of transistor 210 and the capacitance of capacitor 200 determine the charging characteristics of node 252.

As capacitor 200 charges, the voltage at node 252 rises, which increases the gate drive on transistor 212 and decreases the gate drive on transistor 211. As transistor 212 turns on and transistor 211 turns off, node 254 is discharged toward ground through transistor 212. When the control voltage at node 254 drops below the threshold voltage of transistor 213, transistor 213 turns off and ESD discharge circuit 120 is disabled.

Referring now to Vcc override circuit 140, the drain of transistor 220 is coupled to capacitor 201, which is initially discharged. The gate of transistor 220 is maintained at ground by transistor 536. Thus, as Vcc, at the source of transistor 220, rises to the threshold voltage of transistor 220, transistor 220 turns on and charges capacitor 201. Transistor 220 is a long-channel p-type transistor having a low threshold voltage. Similar to transistor 210 discussed above, transistor 220 provides resistance to Vcc override circuit 140 and may be implemented in any appropriate manner.

The voltage at node 250 rises as capacitor 201 charges. When the voltage at node 250 reaches the threshold voltage of transistor 221, transistor 221 turns on and pulls node 254 down. Transistor 221 is preferably a high-voltage transistor having a higher threshold voltage than a low voltage transistor. When the voltage at node 254 is low enough, transistor 213 turns off, which disables ESD clamp circuit 120 and voltages applied to input 100 are applied to circuit 110 (as shown in FIG. 1). Thus, a predetermined length of time after a power supply voltage (Vcc) is applied to the source of transistor 220, ESD clamp circuit 120 is disabled. The predetermined length of time is determined by the RC characteristics of Vcc override circuit 140 and can be varied by any appropriate method.

If a voltage is applied to input 100 when transistor 221 is on and node 254 is at ground, transistor 221 maintains node 254 near ground while transistor 211 turns on, which would otherwise pull node 254 up. Node 254 is maintained below the threshold voltage of transistor 213 by transistor 221, which keeps transistor 213 off and ESD discharge circuit 120 disabled. When both transistors 211 and 221 are on, a small amount of leakage current flows from input 100 to ground through transistors 211 and 221. However, the leakage current is very low compared to the current that flows during an ESD event. As node 252 charges, transistor 211 turns off, which eliminates the flow of leakage current.

The sizing of transistor 210 and capacitor 200 determines the time constant of timer circuit 130, which determines the delay between the application of a voltage to input 100 and the time when ESD clamp circuit 120 is disabled. Similarly, the sizing of transistor 220 and capacitor 201 determines the time constant of Vcc override circuit 140, which determines the delay between the application of a supply voltage to Vcc override circuit 140 and the time when ESD clamp circuit 120 is disabled. According to one embodiment, both time constants are selected to be 2 microseconds; however, any delay longer than an ESD event may also be used. Also, the time constants of timer circuit 130 and Vcc override circuit 140 may differ.

FIG. 3 is timer circuit 130, Vcc override circuit 140 and ESD clamp circuit 120 shown with resistors and pnp transistors. The circuits of FIG. 3 function in the same manner as the circuits of FIG. 2. In timer circuit 130, transistor 210 is replaced by resistor 660. When a voltage is applied to input 100, capacitor 200 is charged through resistor 660. As capacitor 200 charges, the voltage at node 252 rises and the gate drive on transistor 212 increases, while the gate drive on transistor 211 decreases. When the voltage at node 252 reaches a high enough level, transistor 212 turns fully on and the voltage at node 254 is pulled to ground through transistor 212.

In Vcc override circuit 140, transistor 220 is replaced with resistor 650. As Vcc ramps up, capacitor 201 is charged through resistor 650. When node 250 reaches a high enough level, transistor 221 turns fully on, and node 254 is pulled to ground through transistor 254.

In ESD clamp circuit 120, transistors 530–535 are replaced by resistors 630–635. Diodes 520–525 are shown as BJTs 620–625, which channel current to ground through transistor 213 as well as through the collector of each BJT 620–625.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. An arrangement for preventing damage to a circuit of an integrated circuit having an input that provides an input voltage to the circuit, comprising:

a clamping circuit coupling the input to ground when enabled;

a timer circuit coupled to the input and to the clamping circuit, the timer circuit enabling the clamping circuit for a first length of time in response to the input voltage, wherein the first length of time is longer than an electrostatic discharge (ESD) event; and an override circuit coupled to the clamping circuit that disables the clamping circuit if a power supply voltage supplied to the integrated circuit exceeds a predetermined voltage and has been established for a second length of time.

2. The arrangement of claim 1 wherein the timer circuit comprises:

an inverter that supplies the output of the timer circuit;

a capacitor coupled between an input of the inverter and ground; and a pull up transistor coupled such that the capacitor is charged in response to the input voltage.

3. The arrangement of claim 1 wherein the timer circuit comprises:

an inverter that supplies the output of the timer circuit;

a capacitor coupled between an input of the inverter and ground; and a resistor coupled such that the capacitor is charged in response to the input voltage.

4. The arrangement of claim 1 wherein the override circuit comprises:

a transistor having a source coupled to ground, a drain coupled to an output of the override circuit, and a gate coupled to an intermediate timing node;

a capacitor coupled between the intermediate timing node and ground; and a pull up transistor coupled such that the capacitor is charged in response to a power supply output voltage.

5. The arrangement of claim 1 wherein the override circuit comprises:

a transistor having a source coupled to ground, a drain coupled to an output of the override circuit, and a gate coupled to an intermediate timing node;

a capacitor coupled between the intermediate timing node and ground; and a resistor coupled such that the capacitor is charged in response to a power supply output voltage.

6. The circuit of claim 1 wherein the override circuit comprises:

a cantilever diode string having an input and an output, wherein the input of the cantilever diode string is coupled to the input; and a terminating transistor having a drain coupled to an output of the cantilever diode string, a gate coupled to an output of the clamping circuit and to an output of the timer circuit, and a source coupled to ground.

7. A circuit having an input coupled to receive an input voltage, the circuit for steering electrostatic discharge (ESD) current comprising:

an inverter having an output coupled to a control node;

a capacitor coupled between an input of the inverter and ground;

a first pull up transistor that couples the capacitor to the input such that the capacitor is charged in response to the input voltage;

an override circuit coupled to the control node that couples the control node to ground a length of time after a power supply output voltage exceeds a predetermined level; and a clamping circuit that couples the input to ground in response to a voltage level at the control node.

8. The circuit of claim 7 wherein the override circuit comprises:

a pull down transistor having a gate, a source coupled to ground and a drain coupled to the control node;

a capacitor coupled between ground and the gate of the pull down transistor; and a second pull up transistor having a drain coupled to the gate of the pull down transistor, a source coupled to the power supply output and a gate coupled such that the second pull up transistor is on.

9. The circuit of claim 7 wherein the override circuit comprises a cantilever diode string.

10. A circuit that steers current in response to an electrostatic discharge (ESD) event, comprising:

clamping means for shunting the input to ground when enabled;

timing means for enabling the clamping means for a first length of time after an input voltage is supplied to the circuit, wherein the first length of time is longer than an ESD event; and override means for disabling the timing means a second length of time after a power supply voltage level exceeds a predetermined level.

11. The circuit of claim 10 wherein the timing means comprises:

an inverter having an output coupled to the clamping means;

a capacitor coupled between an input of the inverter and ground; and a first pull up transistor that couples the input to the capacitor such that the capacitor is charged in response to the input voltage.

12. The circuit of claim 10 wherein the clamping means comprises a cantilever diode string.

13. The circuit of claim 10 wherein the override means comprises:

a pull down transistor having a gate, a source coupled to ground, and a drain coupled to an output of the override means;

a capacitor coupled between ground and the gate of the pull down transistor; and a second pull up transistor having a drain coupled to the gate of the pull down transistor, a source coupled to a supply voltage such that the capacitor is charged in response to a supply voltage.

14. A method for preventing damage to a circuit of an integrated circuit having an input that provides an input voltage to the circuit, comprising the steps of:

shunting an input to ground in response to the input voltage for a first length of time, wherein the first length of time is longer than an electrostatic discharge (ESD) event;

applying the input voltage to a circuit at the expiration of the first length of time, if the input voltage is applied throughout the first length of time; and disabling the shunting of the input to ground after a power supply output voltage exceeds a predetermined level for a second length of time.

* * * * *

UNITED STATES PATENT AND TRADEMARK OFFICE
CERTIFICATE OF CORRECTION

PATENT NO. : 5,877,927　　　　　　　　　　　　　　　　　　　　　　　Page 1 of 1
DATED : March 2, 1999
INVENTOR(S) : Parat et al.

It is certified that error appears in the above-identified patent and that said Letters Patent is hereby corrected as shown below:

Column 3,
Line 40, delete "$(I_b/i_e)$", insert -- $(i_e/i_b)$ --.

Signed and Sealed this

First Day of June, 2004

JON W. DUDAS
*Acting Director of the United States Patent and Trademark Office*